(12) United States Patent
Ellis-Monaghan et al.

(10) Patent No.: US 9,754,067 B2
(45) Date of Patent: Sep. 5, 2017

(54) METHOD OF CHECKING THE LAYOUT INTEGRITY

(71) Applicant: GLOBALFOUNDRIES INC., Grand Cayman (KY)

(72) Inventors: John J. Ellis-Monaghan, Grand Isle, VT (US); Bertrand Gabillard, Paris (FR); Phillippe Hauviller, Itteville (FR); Michel Rivier, Barbizon (FR)

(73) Assignee: GLOBALFOUNDRIES INC., Grand Cayman (KY)

( * ) Notice: Subject to any disclaimer, the term of this patent is extended or adjusted under 35 U.S.C. 154(b) by 163 days.

(21) Appl. No.: 14/665,242

(22) Filed: Mar. 23, 2015

(65) Prior Publication Data
US 2015/0347667 A1    Dec. 3, 2015

(51) Int. Cl.
*G06F 17/50* (2006.01)
(52) U.S. Cl.
CPC .................. *G06F 17/5081* (2013.01)
(58) Field of Classification Search
CPC ............. G06F 17/5081; G06F 2217/12; G06F 17/5045
USPC .......................................................... 716/119
See application file for complete search history.

(56) References Cited

U.S. PATENT DOCUMENTS

| | | | |
|---|---|---|---|
| 2006/0107055 A1* | 5/2006 | Panwar et al. | 713/176 |
| 2011/0172804 A1* | 7/2011 | Park et al. | 700/110 |
| 2013/0019324 A1* | 1/2013 | Tehranipoor et al. | 726/34 |
| 2013/0198712 A1* | 8/2013 | Koranne et al. | 716/119 |
| 2013/0298094 A1* | 11/2013 | Chen | G06F 17/5081 716/112 |

* cited by examiner

*Primary Examiner* — Suchin Parihar
(74) *Attorney, Agent, or Firm* — Michael LeStrange; Hoffman Warnick LLC (57) ABSTRACT

Checking the layout integrity includes the steps of receiving inputs defining a plurality of devices for a layout, generating a signature for each device in the layout, when created, from one or more parameters of the device, storing the generated signatures with the layout, receiving the stored layout and signatures, regenerating each signature for each device in the stored layout, and comparing each regenerated signature with the corresponding stored signature.

9 Claims, 6 Drawing Sheets

METHOD OF CHECKING THE LAYOUT INTEGRITY

FIELD OF THE INVENTION

The present disclosure relates generally to a method and a system for checking the layout integrity.

BACKGROUND

Electronic design automation (EDA) is a category of software tools for designing electronic systems such as printed circuit boards and integrated circuits. The tools work together in a design flow that chip designers use to design and analyse entire semiconductor chips. A process design kit (PDK) is a set of files used within the semiconductor industry to model devices such as transistors in the layout of a chip and are used with a suitable design software tool such as Cadence. In order to efficiently design complex circuits, each device of the PDK is generated by a parameterized cell (pcell) that automatically builds the different required shapes and layers. The pcell guarantees the integrity of the layout, and its compliance to manufacturing rules. When designing a product, the engineers may have to "flatten" a pcell, which breaks the built-in relationship between shapes and levels of the original device. In other words, when the device is flattened, the engineers can freely move shapes with respect to each other that may result in an improper device behaviour.

In a PDK, the proper electrical behaviour of each device is guaranteed by a series of ground rules that fix the relative position (spacing, width, and the like) of each shape that belongs to a specific device. The rules are coded in a validation tool referenced as Design Rule Checker (DRC), provided by several EDA vendors such as Cadence, Mentor Graphics and Synopsys. For most devices, simple DRC checks are sufficient to verify the proper integrity of the device. As an example, the checking of channel width and length of low voltage FETs is sufficient to guarantee a device behaviour consistent with that of the model. For advanced technology nodes and analogue, RF and power technologies more complex structures such as bipolar transistors, or high voltage FETs are widely used in such advanced products.

More complex rules have to be implemented to validate these more complex structures that involve more shapes, more design layers and larger circuits in the layout. In turn, this imposes new constraints on the validation tools, both in terms of runtime and capabilities. The complex rules are often referred as "element rules", since they relate to a single device also known as an element, and form part of a new class of DRC checks referenced as ERC (Electrical Rule Checks). Presently, existing DRC/ERC algorithms and production tools, as well as limited time used to develop and code complex rules, resulting possible errors in the validation of large and complex designs.

SUMMARY

According to a first aspect, there is provided a method of checking layout integrity, the method including the steps of receiving inputs defining a plurality of devices for a layout, generating a signature for each device in the layout, when created, from one or more parameters of the device, storing the generated signatures with the layout, receiving the stored layout and signatures, regenerating each signature for each device in the stored layout, and comparing each regenerated signature with the corresponding stored signature.

According to a second aspect, an embodiment of the present invention provides a system for checking layout integrity, the system including a processor arranged to receive inputs defining a plurality of devices for a layout, generating a signature for each device in the layout, when created from one or more parameters of the device, storing the generated signatures with the layout, receiving the stored layout and signatures, regenerating each signature for each device in the stored layout, and comparing each regenerated signature with the corresponding stored signature.

According to a third aspect, an embodiment of the present invention provided a computer program product on a computer readable medium for checking layout integrity, the product including instructions for receiving inputs defining a plurality of devices for a layout, generating a signature for each device in the layout when created from one or more parameters of the device, storing the generated signatures with the layout, receiving the stored layout and signatures, regenerating each signature for each device in the stored layout, and comparing each regenerated signature with the corresponding stored signature.

The verification of the integrity of the positioning of the necessary shapes and/or levels are preferably used to design complex semiconductor structures in an efficient and effective manner. Instead of checking widths and spacing between shapes and layers, as in DRC for example, the method generates a signature for each device in the design when its layout is created. The signature is preferably a numerical representation of all of the shapes that are necessary to generate a fully functioning device. Each separate layout based on a set of device parameters available to the user is therefore represented by a specific number. The integrity of the signature during the full design cycle may be used to check the invariance of the layout. By way of example, prior to manufacturing masks there will be a recalculation of the signature of each device in the layout and a comparison of the recalculated signature with the original signature. Any difference is then reported as an error.

Preferably, each device in the layout includes a plurality of shapes and the step of generating a signature for each device in the layout includes generating a numerical representation of the shapes of the respective device. The signature can be easily calculated and stored if it is generated as a number derived from the shapes that are used to create the individual devices of the layout. Preferably, the signature is generated using a commutative mathematical operation of one or more parameters of each shape of the respective device. By using a commutative operation, the signature for the device becomes independent of the order in which the shapes are created for the individual device. In an embodiment, the signature is generated from the coordinates of polygon vertices, perimeter and areas of each of the shapes of the respective device.

The method further includes providing an output for each regenerated signature that does not match the corresponding stored signature. The checking method is ideally designed to identify those devices whose recalculated signatures do not match their stored signatures, as this indicates that an error has occurred somewhere in the design process. If there is a failure to match, then this implies that either a change was made during the design of the layout that inadvertently changed a device that had already been placed in the layout or that transmission of the layout has introduced an error into the layout design. This checking of the layout integrity will find these errors before they are, for example, embodied into an actual chip or mask and can still be corrected in the layout.

It is important to make sure that each device in the layout created by a combination of cells parameters has a specific signature. It is relatively straightforward to compute the coordinates of polygon vertices, perimeter and areas of shapes. Since it cannot be controlled which shape will be manipulated first, and which shape will be used last for this computation, it is desirable to use a simple operation, such as a sum that is commutative. Finally, the coordinates of the different points within the cell will be calculated with reference to the origin of a "reference" shape. Any shift in a given shape or additional shape within the reference outline will result in a signature change that will be detected. This approach therefore provides coverage of all possible layer shifts/changes/adds that may alter the electrical performance of complex devices, and offers significant advantages over traditional DRC verification. To generate a unique signature of a polygonal shape (a square and a rectangle being examples of a polygon) it is possible to compute the sum of: coordinates of points, perimeter, area, coordinates of centroid and sum of absolute value of diagonal slope.

BRIEF DESCRIPTION OF THE DRAWINGS a. Preferred embodiments of the present invention will now be described, by way of examples with reference to the following drawings, in which b.

g. It is noted that FIGS. 2 through 5 show different views of a graphical user interface.

DETAILED DESCRIPTION OF THE DRAWINGS

Figure 1:
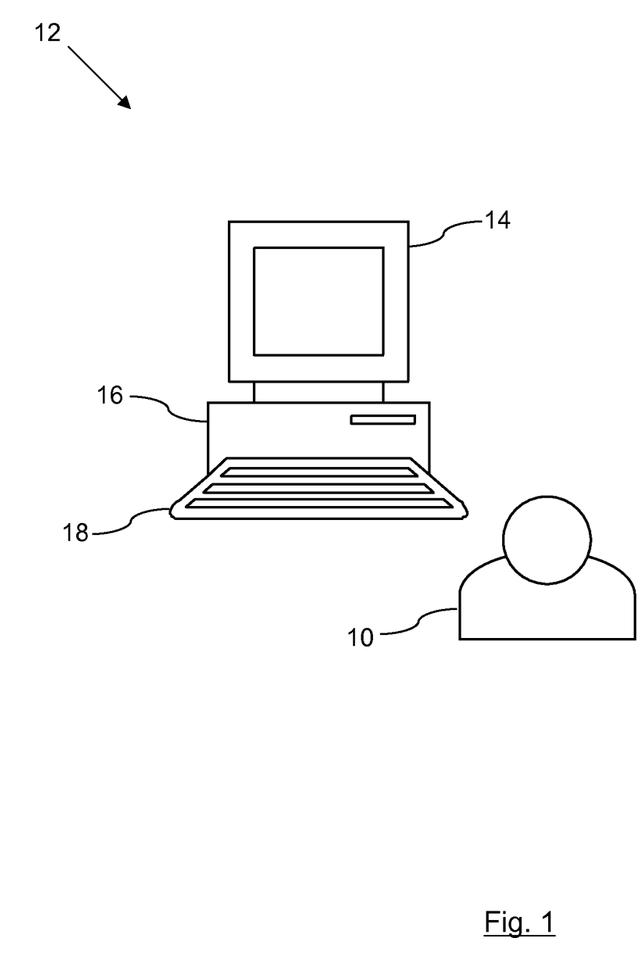
FIG. 1 is a schematic diagram of a computer system.

FIG. 1 shows an operator 10 using a desktop computer system 12 to create a layout for a semiconductor chip. Computer system 12 includes a display device 14, a processor 16 and a user input device (a conventional keyboard) 18. The processor 16 is running a suitable software application such as Cadence, which is a specifically designed software package for the engineer 10 to use in order to create a layout for a semiconductor chip. The engineer 10 interacts with a graphical user interface (GUI) displayed by the display device 14 in order to create devices within the layout. Each device of the layout is created as a plurality of shapes within the GUI.

A layout for a semiconductor chip will contain many thousands of different devices, such as transistors, each of which will contain multiple different shapes. A process design kit (PDK) is a set of files used to model these devices in the layout of a chip and are used with the design software tool being run by the computer system 12. The operator 10 uses the computer system 12 in order to interact with the software application, which has access to the PDK (which is stored either locally or remotely), in order to build up the devices that form the layout on which the operator 10 is working.

In order to efficiently design the complex circuits of a layout, each device of a PDK is generated by a parameterized cell (pcell) that automatically builds the different required shapes and layers within the device. This pcell guarantees the integrity of the layout, and its compliance to the necessary manufacturing rules that will ensure that the final chip built to the design will work properly. When designing a product, an engineer 10 may have to "flatten" a pcell, which will break the built-in relationship between the shapes and levels of the original device. In other words, when a device is flattened, the engineer 10 can freely move shapes with respect to each other that may result in an improper device behaviour.

Figure 2:
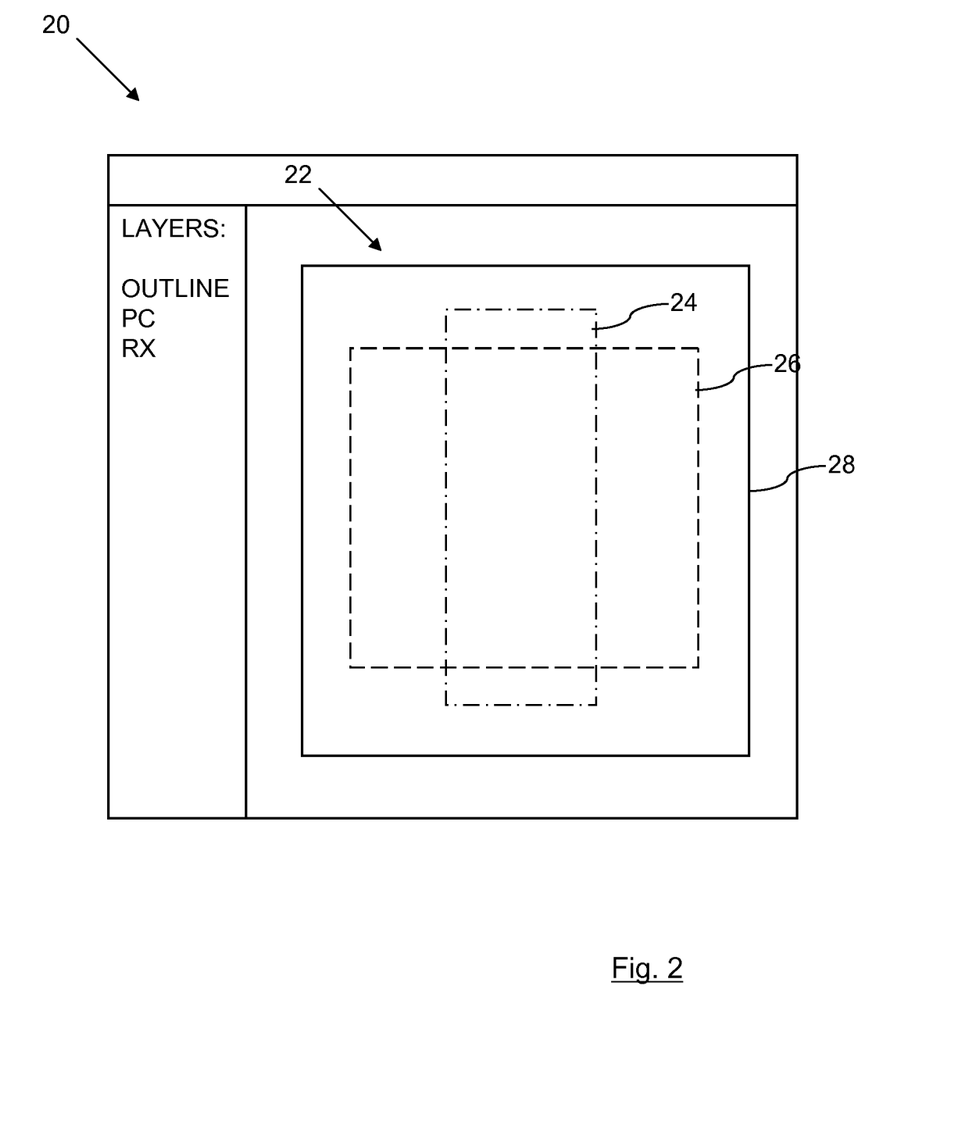
FIG. 2 illustrates the bottom left hand column version and the right column MY mirrored through the x axis.

Using a regular PDK, devices are created in a layout view by the engineer 10 using a parametrized cell. FIG. 2 illustrates this approach, which uses a generic simplified approach that could represent the creation of a two mask bulk field effect transistor, for example. FIG. 2 shows a GUI 20 for the software application that is used to create a layout, as shown on the display device 14. The engineer 10 is using the GUI 20 to create a device 22 from a pcell. The pcell will generate three shapes, a polysilicon gate (PC) 24, a diffusion area (RX) 26 and an outline 28 as the basis for this specific device 22.

Each device 22 that is defined for the layout has a signature generated when the device is created. The computation of the original signature for the device 22 does not require any additional specific step, it can be easily and quickly performed during the creation of the layout using the pcell. Since each device 22 has to have its own signature, and that the number of devices to be checked in any complex design can be rather large, it is important to keep the computation time as small as possible. Since simple pcells algorithms are based on layers, position of shapes, these have been used to create the signature.

First, an outline has to be defined as a reference shape that contains all the critical layers and shapes. The device engineer 10 has the responsibility to define which shapes should be enclosed in the outline, and which layers are critical to check the proper device integrity. Finally, each device 22 should be clearly identified, and the chosen outline should not overlap in a real design. This is the case for high voltage devices. In FIG. 2, the outline 28 can be seen, which contains within it the polysilicon gate 24 and the diffusion area 26. Here the overall outline 28 of the device 22 contains within it two different shapes, the polysilicon gate 24 and the diffusion area 26.

Figure 3:
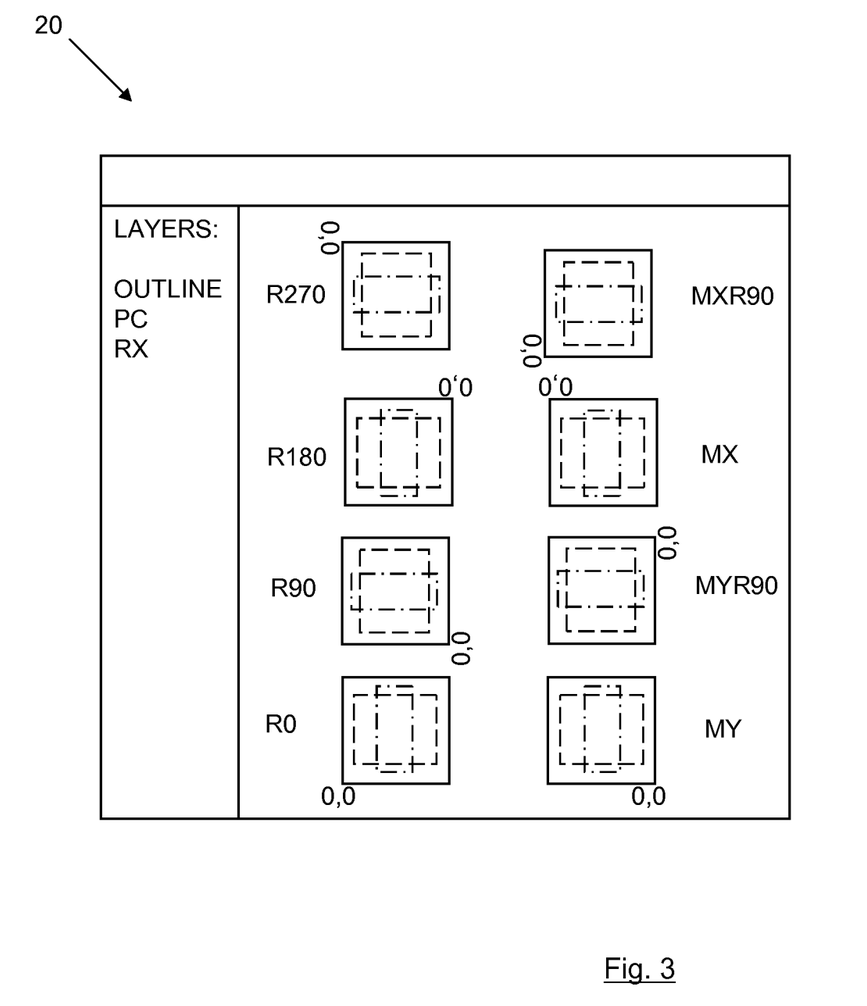
FIG. 3 shows eight different possibilities for placing shapes of a device based on the pcell shown in FIG. 2.

Once the outline 28 has been identified, an origin (0,0 in the x-y plane) has to be defined to compute the coordinates of each point used to create the shapes on each of the levels within the device 22. This is important, since the designer 10 can perform operations of rotation and/or mirroring while placing a given pcell in a layout. FIG. 3 shows eight different possibilities for the placing of the shapes of the device 22 based on the pcell shown in FIG. 2. These represent standard manipulations that the engineer 10 can make when creating a device 22 for the layout and the signature generation needs to be flexible enough to take account of them.

The eight different possibilities are labelled as follows, left-hand column from bottom to top: R0, R90, R180 and R270 and right-hand column from bottom to top: MY, MYR90, MX and MXR90, in order to explain the different translations undertaken to achieve each specific version. In this labelling scheme used, "R" means rotation and "M"

means mirror and the numbers refer to degree clockwise rotations, so that R90 is an anti-clockwise rotation by 90 degrees, for example. For each of the eight different versions, the original origin 0,0 is marked on each version, so that it can be seen how the translation has actually moved the origin from its original position.

Therefore, the bottom left-hand column version (labelled R0) is the same original pcell position as shown in FIG. 2 and the remainder of this column are anti-clockwise rotations stepping through 90 degree increments of that pcell (note the changing position of the marked origin 0,0 in each version). In the right-hand column, the bottom version MY is the version of FIG. 2, though mirrored through the Y axis (a reflectional transformation) and MYR90 is that version rotated anti-clockwise by 90 degrees. Similarly the version MX is the same pcell version of FIG. 2 but mirrored through the X axis (again a reflectional transformation) and MXR90 is that version rotated anti-clockwise by 90 degrees.

It is important that the algorithm used for the generation of the signature is able to handle each shape being placed in a device in different orders during its initial creation, or when it is placed in a real design, and therefore the algorithm uses a mathematical operator that is commutative (i.e. a*b=b*a, wherein * is the operator). The simplest operator of this kind is the sum. This will result in a calculation that is independent of the order in which the shapes are placed into the device 22 that is being created in the layout. Each shape in a device 22 will be used in the generation of the signature.

Figure 4:
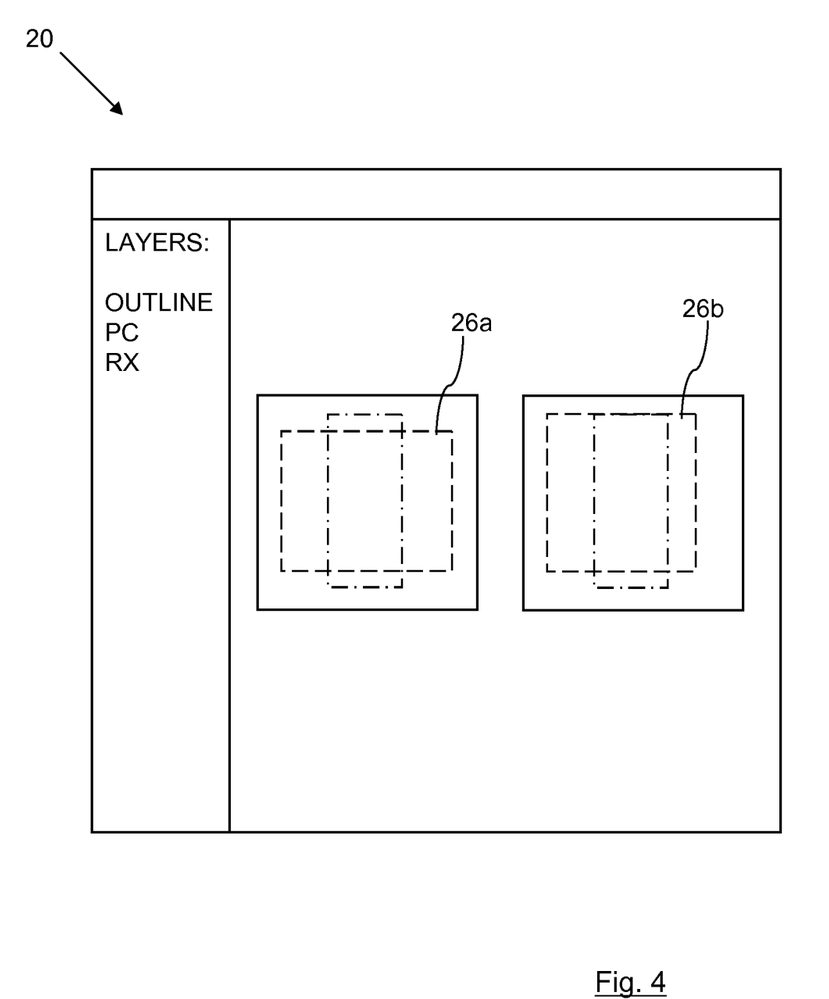
FIG. 4 illustrates two rectangles drawn on an axe RX layer in the left and right pcells providing the same signature.

Pcell algorithms provide simple ways to compute coordinates of points, perimeters and areas of polygonal shapes to use in the signature calculation. In order to minimize the computation time, both at creation and verification, it is highly desirable to use simple algorithms. It can be easily demonstrated, on a single rectangle, that the sum of the coordinates is insufficient to provide a distinguishing signature for a given layout. As an example, as shown in FIG. 4, the two rectangles 26a and 26b drawn on the RX layer in the left and right pcell will provide the same signature, even though they are in different positions within the device. A slightly more complex signature algorithm is therefore required.

In the preferred embodiment of the process of generating a signature for each device 22 in the layout, the signature is generated from the coordinates of polygon vertices, perimeter and areas of each of the shapes of the device 22 using a commutative operation such as a sum. This will turn the physical representation of the device 22 into a numerical representation for that device 22. This signature generation occurs in the background while the operator 10 is working on their layout and each signature generated is stored with the layout, linked to the specific device 22 in the layout, without the operator 10 being necessarily aware that this is occurring.

Figure 5:
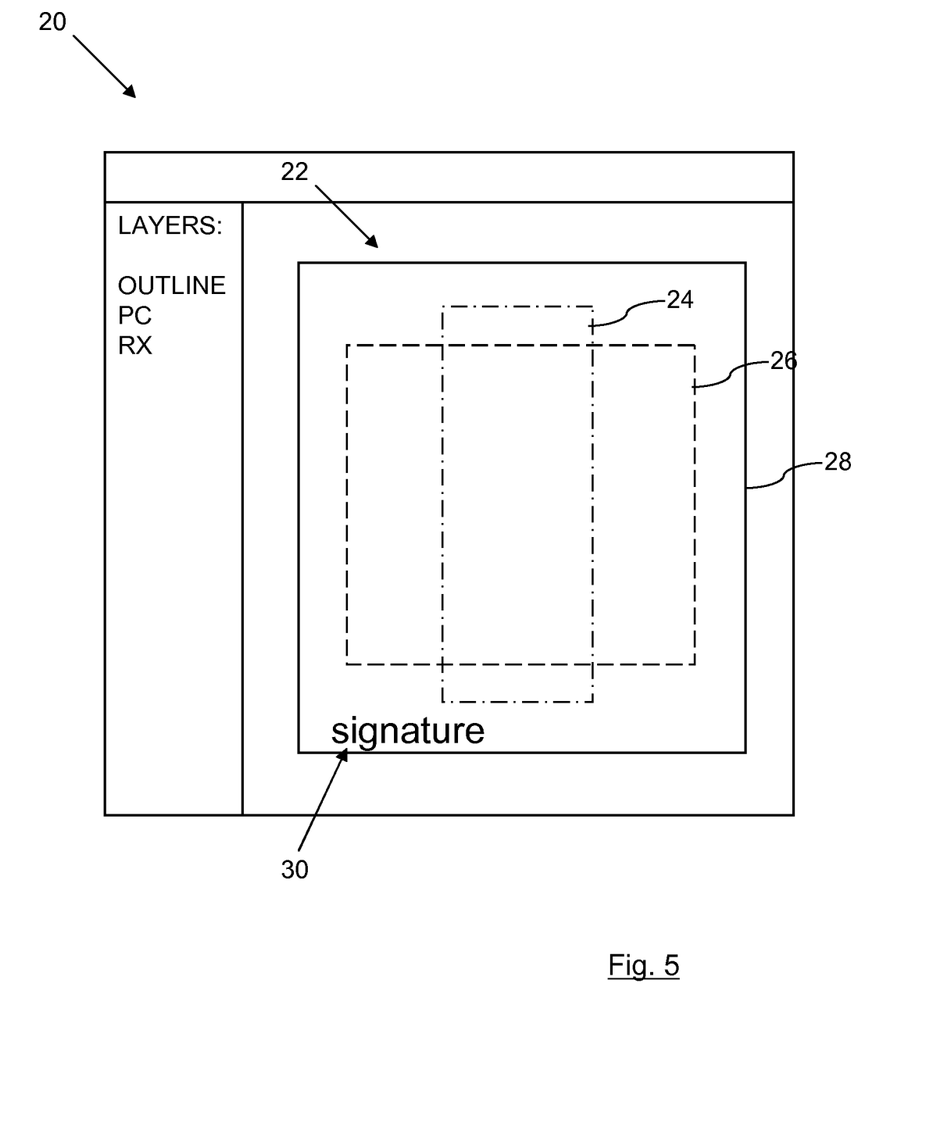
FIG. 5 shows the generated signature created as a string forming part of the layout.

The sum of coordinates, perimeter and area of the present polygonal shapes in any given design used to manufacture complex semiconductor devices will be sufficient to provide a usable signature. In general, the sum of coordinates and their perimeter is an insufficient signature to discriminate two separate layouts. With this approach, the code used to generate the pcell is extended to generate text within the outline shape that will represent the signature of the device layout, when created. FIG. 5 illustrates this point, where, in the preferred embodiment, the generated signature 30 is created as a string that forms part of the layout of the respective device 22 within the GUI of the software application.

In the final customer design, the same algorithm will be reapplied to verify the integrity of the devices under test. The following procedure will be used. The devices 22 that need to be checked will first be identified by the presence of a specific outline shape 28. These outlines 28 must not overlap (an error will be displayed if this is not the case). The original signature 30 that is stored in a predefined layer as text will be read. The origin of the outline shapes 28 will be identified. All the levels/shapes of interest that overlap the outline shape will be identified.

The exact algorithm used to compute the signature 30 will be reapplied on all the filtered shapes, using the outline origin as a reference. The 'final' signature will be compared with the original signature 28 and pass/fail criteria will be applied based on match/mismatch of both signatures. In this way, if any changes have been to a device 22 after it has been completed, either accidently or through errors occurring during transmission of the layout, then this will be identified, since the regenerated signature will not match the original signature 30 that forms part of the device 22. All devices 22 within the layout can be tested in the same way.

Figure 6:
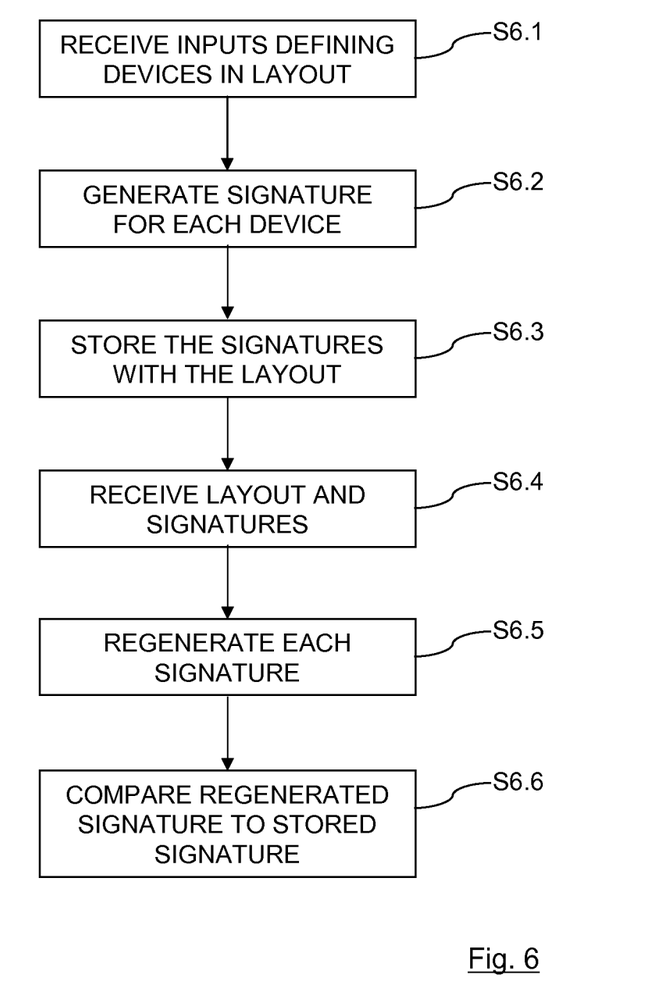
FIG. 6 shows a flowchart applicable of a method checking the layout integrity.

FIG. 6 shows a flowchart which summarises the method of checking the layout integrity. The method comprising the steps of firstly, step S6.1, which includes receiving inputs defining a plurality of devices 22 for a layout, secondly, step S6.2, which includes generating a signature 30 for each device 22 in the layout, when created, from one or more parameters of the device 22, and thirdly step S6.3, which includes storing the generated signatures 30 with the layout. As the operator 10 creates the layout, each device 22 that is completed will have its respective signature 30 stored within the layout, which could be as described above with reference to FIG. 5.

At the checking part of the process, the steps of the process includes step S6.4, which includes receiving the stored layout and signatures 30, step S6.5, which includes regenerating each signature for each device 22 in the stored layout, and step S6.6, which includes comparing each regenerated signature with the corresponding stored signature 30. An output is provided for each regenerated signature that does not match the corresponding stored signature 30. Any device 22 that has a stored signature 30 that does not match the regenerated signature will generate an error message. This will catch any change that has been made to a device 22 in the layout after its original creation.

It is therefore possible to perform the verification of the integrity of the positioning of the necessary shapes/levels that are used to design complex semiconductor structures in an efficient and effective manner. The process generates a signature 30 for each device 22 in the layout when it is created. This signature 30 is preferably a numerical representation of all of the shapes that are necessary to generate a fully functioning device 22. The integrity of this signature 30 can be used to check the invariance of the layout. For example, prior to manufacturing masks, there will be a recalculation of the signature of each device 22 in the layout and a comparison of the recalculated signature with the original signature 30 and any difference will be reported as an error.

An embodiment of the present invention may be a system, a method, and/or a computer program product. The computer program product may include a computer readable storage medium (or media) having computer readable program instructions thereon for an embodiment causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of an embodiment of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order for an embodiment perform aspects of the present invention.

In an aspect of an embodiment of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:

1. A method of checking layout integrity, performed on a computer system having a processor and a memory coupled with the processor, the method comprising:
   receiving inputs defining a plurality of devices for a layout,
   generating a signature for each device in the layout, when the layout is created, from one or more parameters of the device in the processor, wherein the signature is generated from a commutative mathematical operation of one or more parameters of each shape of the respective device, the signature further generated from the coordinates of polygon vertices, perimeter and areas of each of the shapes of the respective device, storing the generated signatures for the layout with the layout in the memory, receiving the stored layout and generated signatures from the memory, regenerating each signature for each device in the stored layout after receiving the stored layout and the generated signatures, comparing each regenerated signature with the corresponding stored signature, and providing an output for each regenerated signature that does not match the corresponding stored signature.

2. The method according to claim 1, wherein each device in the layout includes a plurality of shapes and the process of generating the signature for each device in the layout comprises generating a numerical representation of the shapes of the respective device.

3. The method of claim 1, wherein the generated signature is a string forming a part of the layout of each device.

4. A system for checking integrity of a layout, the system comprising:

a computer system including a processor and a memory coupled with the processor, the computer system arranged to:

receive inputs defining a plurality of devices for the layout, generate a signature for each device in the layout, when the layout is created, from one or more parameters of the device, wherein the signature is generated from a commutative mathematical operation of one or more parameters of each shape of the respective device, the signature further generated from the coordinates of polygon vertices, perimeter and areas of each of the shapes of the respective device, store the generated signatures for the layout with the layout, receive the stored layout and generated signatures, regenerate each signature for each device in the stored layout after receiving the stored layout and the generated signatures, compare each regenerated signature with the corresponding stored signature, and provide an output for each regenerated signature that does not match the corresponding stored signature.

5. The system according to claim 4, wherein each device in the layout comprises a plurality of shapes and the processor is arranged, when generating the signature for each device in the layout, to generate a numerical representation of the shapes of the respective device.

6. The system of claim 4, wherein the generated signature is a string forming a part of the layout of each device.

7. A non-transitory storage device readable by a machine for checking layout integrity, includes instructions that when executed by the machine, cause the machine to perform actions comprising:

receiving inputs defining a plurality of devices for a layout, generating a signature for each device in the layout, when the layout is created, from one or more parameters of the device, wherein the signature is generated from a commutative mathematical operation of one or more parameters of each shape of the respective device, the signature further generated from the coordinates of polygon vertices, perimeter and areas of each of the shapes of the respective device, storing the generated signatures for the layout with the layout, receiving the stored layout and generated signatures, regenerating each signature for each device in the stored layout after receiving the stored layout and the generated signatures, comparing each regenerated signature with the corresponding stored signature, and providing an output for each regenerated signature that does not match the corresponding stored signature.

8. The non-transitory storage device according to claim 7, wherein each device in the layout comprises a plurality of shapes and the instructions for generating the signature for each device in the layout comprise instructions for generating a numerical representation of the shapes of the respective device.

9. The non-transitory storage device of claim 7, wherein the generated signature is a string forming a part of the layout of each device.

* * * * *